(12) United States Patent
Sasaki

(10) Patent No.: US 6,876,402 B2
(45) Date of Patent: Apr. 5, 2005

(54) TELEVISION TUNER INTERMEDIATE-FREQUENCY CIRCUIT THAT HARDLY SUFFERS DISTURBANCE OF ADJACENT CHANNEL

(75) Inventor: Michinori Sasaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 559 days.

(21) Appl. No.: 10/116,818

(22) Filed: Apr. 5, 2002

(65) Prior Publication Data

US 2002/0145681 A1 Oct. 10, 2002

(30) Foreign Application Priority Data

Apr. 9, 2001 (JP) ........................................ 2001-110506

(51) Int. Cl.$^7$ ................................................. H04N 5/44
(52) U.S. Cl. ...................................... 348/731; 348/725
(58) Field of Search ................................. 348/725, 726, 348/731, 21; 455/188.1, 283, 284, 286, 287, 290, 293, 296, 307, 501, 63.1

(56) References Cited

U.S. PATENT DOCUMENTS 6,583,826 B1 * 6/2003 Sawamoto et al. ......... 348/731

FOREIGN PATENT DOCUMENTS

JP           2001-196961         7/2001

* cited by examiner

*Primary Examiner*—David E. Harvey
(74) *Attorney, Agent, or Firm*—Brinks Hofer Gilson & Lione

(57) ABSTRACT

1. The object of the invention is to configure so that a video intermediate-frequency signal and a voice intermediate-frequency signal respectively included in an adjacent channel can be damped without having an effect upon a tuning characteristic of an intermediate frequency tuning circuit.

2. To achieve the object, an integrated circuit including a balanced type mixer provided with a first output terminal and a second output terminal as well as a balanced type intermediate-frequency amplifier provided with a first input terminal and a second input terminal is provided, the first output terminal and the first input terminal as well as the second output terminal and the second input terminal are respectively connected via a first capacitative element formed in the integrated circuit, a first external terminal connected to the first output terminal, a second external terminal connected to the second output terminal and a third external terminal connected to the first input terminal are provided to the integrated circuit, an intermediate frequency tuning circuit is connected between the first external terminal and the second external terminal, and the first external terminal and the third external terminal are connected via an inductance element.

2 Claims, 2 Drawing Sheets

TELEVISION TUNER INTERMEDIATE-FREQUENCY CIRCUIT THAT HARDLY SUFFERS DISTURBANCE OF ADJACENT CHANNEL

BACKGROUND OF THE INVENTION

1. Field of the Invention

The present invention relates to an intermediate-frequency circuit of a television tuner, and more specifically relates to an intermediate-frequency circuit formed of a integrated circuit of a television tuner.

2. Description of the Related Art

Referring to FIG. 6, an intermediate-frequency circuit of a conventional type television tuner will be described below. An integrated circuit 21 includes a mixer 22, an intermediate-frequency amplifier 23 and in addition, a local oscillator (not shown). The mixer 22 is formed as a balanced type mixer provided with balanced output terminals, a television signal RF of a receive channel selected by an external double-tuned circuit is input to the mixer 22 and a signal oscillated from the local oscillator is input to the mixer 22. An intermediate-frequency signal after frequency conversion is output from the mixer 22.

The intermediate-frequency amplifier 23 is formed as a balanced type amplifier provided with balanced input terminals. The balanced output terminal of the mixer 22 and the balanced input terminal of the intermediate-frequency amplifier 23 are connected via each connecting capacitative element 24 in the integrated circuit 21 and an intermediate-frequency signal is input to the intermediate-frequency amplifier 23. In the integrated circuit 21, two external terminals 21a and 21b respectively connected to the balanced output terminals of the mixer 22 are also provided and an intermediate frequency tuning circuit 25 is connected between the external terminals 21a and 21b. The intermediate frequency tuning circuit 25 is provided with a tuning characteristic that the intermediate frequency turning circuit tunes to a substantially intermediate frequency between a video intermediate carrier Fp and a chrominance subcarrier Fc as shown in FIG. 7.

As described above, a television signal of an adjacent channel is removed by providing the intermediate frequency tuning circuit 25 connected between the external terminals 21a and 21b between the mixer 22 and the intermediate-frequency amplifier 23, only a television signal of a receive channel is input to the intermediate-frequency amplifier 23 and an intermediate-frequency signal IF output from the intermediate-frequency amplifier 23 is input to an image detector (not shown) via a SAW filter (not shown) provided outside the integrated circuit 21 (as well as other components).

However, in this configuration, a television signal of an adjacent channel cannot be sufficiently damped and a television signal of a receive channel is disturbed by a video intermediate-frequency signal and a voice intermediate-frequency signal respectively included in the adjacent channel. For a measure against this, a trap circuit for damping a video intermediate-frequency signal and a voice intermediate-frequency signal respectively included in an adjacent channel has only to be provided in the tuning circuit 25, however, then, there occurs a problem that the intermediate frequency tuning circuit 25 and the trap circuit have an effect upon each other and it becomes difficult to set a tuning frequency and a trapping frequency.

SUMMARY OF THE INVENTION

One object of the invention is to provide an arrangement in which a video intermediate-frequency signal and a voice intermediate-frequency signal respectively included in an adjacent channel can be damped without having an effect upon a tuning characteristic of an intermediate frequency tuning circuit.

To achieve the above and other objects, the invention is provided with an integrated circuit including a balanced type mixer provided with a first output terminal and a second output terminal for converting a frequency as well as a balanced type intermediate-frequency amplifier provided with a first input terminal and a second input terminal, the first output terminal and the first input terminal as well as the second output terminal and the second input terminal are respectively connected via each first capacitative element formed in the integrated circuit, a first external terminal connected to the first output terminal, a second external terminal connected to the second output terminal and a third external terminal connected to the first input terminal are provided to the integrated circuit, an intermediate frequency tuning circuit that tunes to a substantially central frequency in an intermediate frequency band is connected between the first external terminal and the second external terminal, and the first external terminal and the third external terminal are connected via an inductance element.

Also, a second capacitative element is connected to the inductance element in series, a series-parallel resonance circuit is formed by the first capacitative element, the inductance element and the second capacitative element, a series resonance frequency of the series-parallel resonance circuit is substantially equalized to the central frequency and a parallel resonance frequency is equalized to a frequency of a voice intermediate carrier of an adjacent channel on a downside.

DETAILED DESCRIPTION OF THE PREFERRED EMBODIMENTS

Figure 1:
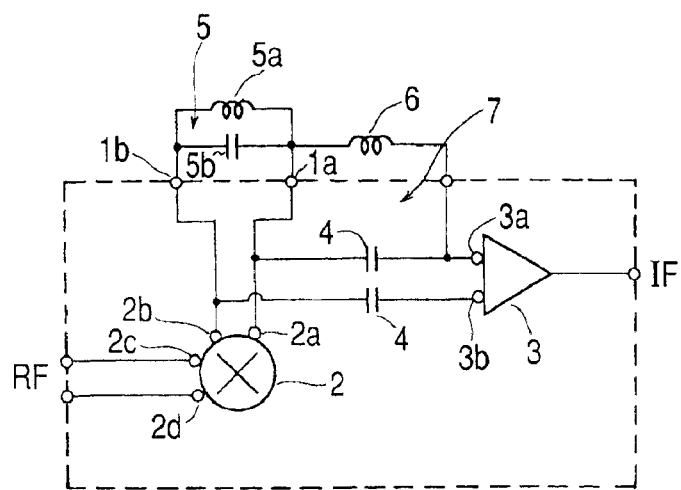
FIG. 1 is a circuit diagram showing the configuration of an intermediate-frequency circuit of a television tuner according to the invention.

Referring to the drawings, an intermediate-frequency circuit of a television tuner according to the invention will be described below. As shown in FIG. 1, an integrated circuit 1 includes a mixer 2, an intermediate-frequency amplifier 3 and in addition, a local oscillator (not shown). The mixer 2 is formed as a balanced type mixer provided with a first output terminal 2a and a second output terminal 2b, a television signal RF of a receive channel selected by a double-tuned circuit (not shown) provided outside the integrated circuit 1 is input to two balanced input terminals 2c and 2d of the mixer 2 and a signal oscillated from the local oscillator in the integrated circuit 1 is input to the mixer. An intermediate-frequency signal after frequency conversion is output from the mixer 2.

The intermediate-frequency amplifier 3 is formed as a balanced type amplifier provided with a first input terminal 3a and a second input terminal 3b. The first output terminal 2a of the mixer 2 and the first input terminal 3a of the intermediate-frequency amplifier 3 as well as the second output terminal 2b of the mixer 2 and the second input terminal 3b of the intermediate-frequency amplifier 3 are respectively connected via first capacitative elements 4, 4 formed in the integrated circuit 1. Hereby, an intermediate-frequency signal is input to the intermediate-frequency amplifier 3 in a balanced state.

Figure 2:
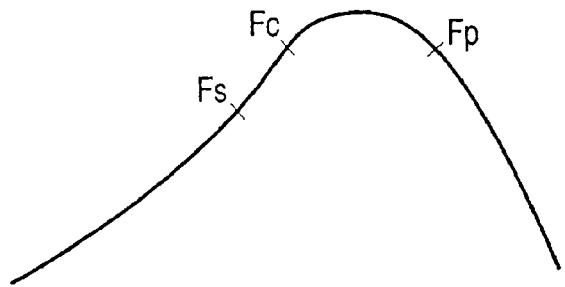
FIG. 2 shows a tuning characteristic of an intermediate frequency tuning circuit used in the intermediate-frequency circuit of the television tuner according to the invention.

A first external terminal 1a connected to the first output terminal 2a of the mixer 2 and a second external terminal 1b connected to the second output terminal 2b are also provided to the integrated circuit 1 and an intermediate frequency tuning circuit 5 is connected between these external terminals 1a and 1b. The intermediate frequency tuning circuit 5 is formed by a parallel tuning circuit composed of an inductance element 5a and a capacitative element 5b and is provided with a tuning characteristic that the intermediate frequency tuning circuit tunes to a substantially intermediate frequency between a video intermediate carrier Fp and a chrominance subcarrier Fc respectively shown in FIG. 2.

A third external terminal 1c connected to the first input terminal 3a of the intermediate-frequency amplifier 3 is also provided to the integrated circuit 1 and an inductance element 6 is connected between the first external terminal 1a and the third external terminal 1c. As a result, a parallel resonance circuit 7 is formed by the first capacitative element 4 and the inductance element 6. The parallel resonance circuit 7 is set so that it resonates with a voice intermediate carrier −Fs of an adjacent channel on the downside adjacent on the downside (i.e. the lower side of the response curve) of a receive channel.

Figure 3:
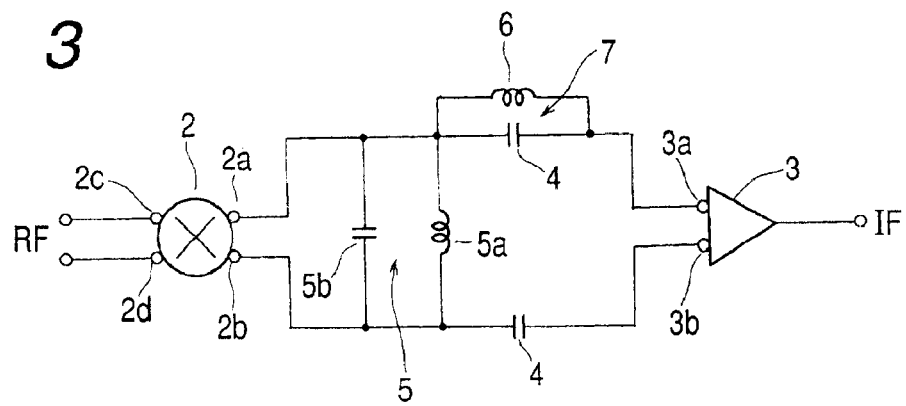
FIG. 3 shows an equivalent circuit of the intermediate-frequency circuit of the television tuner according to the invention.
Figure 4:
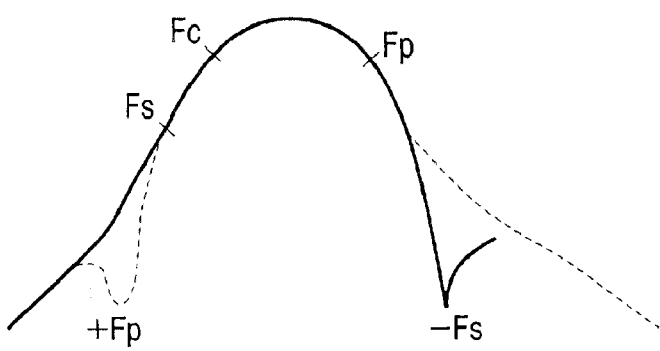
FIG. 4 shows a transmission characteristic of the intermediate-frequency circuit of the television tuner according to the invention.

As a result, an equivalent circuit shown in FIG. 3 is formed between the mixer 2 and the intermediate-frequency amplifier 3. As the intermediate frequency tuning circuit 5 tunes to the substantially intermediate frequency between the video intermediate carrier Fp and the chrominance subcarrier. Fc and the parallel resonance circuit 7 resonates with the voice intermediate carrier −Fs of the adjacent channel on the downside, a transmission characteristic between the mixer 2 and the intermediate-frequency amplifier 3 is as shown in FIG. 4, and the voice intermediate carrier −Fs of the adjacent channel on the downside is trapped. Therefore, the intermediate-frequency circuit according to the invention hardly suffers disturbance by a voice intermediate-frequency signal of the adjacent channel on the downside. In this case, as the parallel resonance circuit 7 is independent from the intermediate frequency tuning circuit 5, a resonance frequency or a tuning frequency never has an effect upon each other and the setting of their frequencies becomes easy. An intermediate-frequency signal IF output from the intermediate-frequency amplifier 3 is input to a video detector (not shown) via an SAW filer (not shown) provided outside the integrated circuit 1 and others.

In the above description, the parallel resonance circuit 7 is made to resonate with the voice intermediate carrier −Fs of the adjacent channel on the downside, however, the parallel resonance circuit may also be made to resonate with a video intermediate carrier +Fp of an adjacent channel on the upside adjacent on the upside of the receive channel. A transmission characteristic in this case is as shown by a dotted line in FIG. 4 and the intermediate-frequency circuit according to the invention hardly suffers disturbance by the video intermediate-frequency signal on the adjacent channel on the upside.

Figure 5:
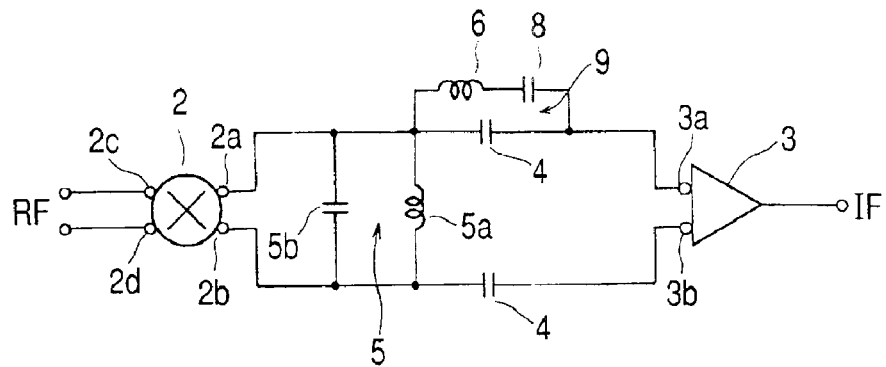
FIG. 5 shows another equivalent circuit of the intermediate-frequency circuit of the television tuner according to the invention.
Figure 6:
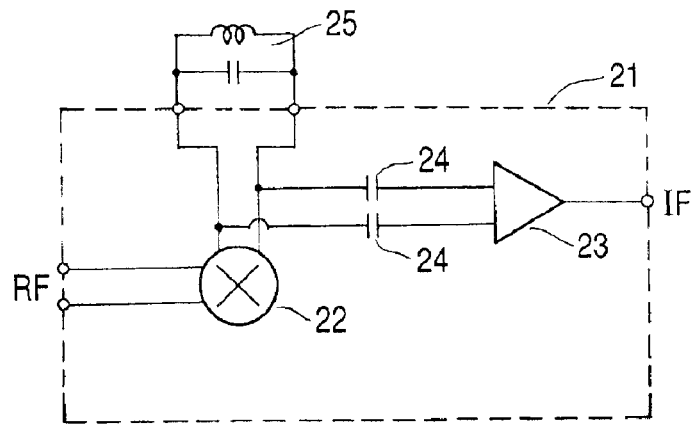
FIG. 6 is a circuit diagram showing the configuration of an intermediate-frequency circuit of a conventional type television tuner.
Figure 7:
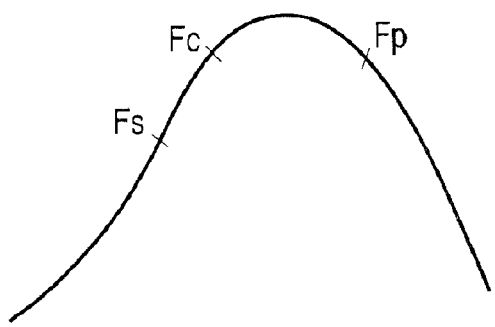
FIG. 7 shows a tuning characteristic of an intermediate frequency tuning circuit used in the intermediate-frequency circuit of the conventional type television tuner.

If a second capacitative element 8 is connected to the inductance element 6 shown in FIG. 1 in series, a sires-parallel resonance circuit 9 is formed by the inductance element 6, the first capacitative element 4 and the second capacitative element 8 as shown in FIG. 5. In this case, if a series resonance frequency by the inductance element 6 and the second capacitative element 8 is set to the substantially intermediate frequency between the video intermediate carrier Fp of the receive channel and the chrominance subcarrier Fc and the whole parallel resonance frequency is set to the voice intermediate carrier −Fs of the adjacent channel on the downside, a transmission characteristic between the mixer 2 and the intermediate-frequency amplifier 3 is as shown in FIG. 4 and the intermediate-frequency circuit according to the invention similarly hardly suffers disturbance by a voice intermediate-frequency signal of the adjacent channel on the downside.

As described above, the parallel resonance circuit 7 or the series-parallel resonance circuit 9 having no effect upon the intermediate frequency tuning circuit 5 can be provided by connecting the inductance element 6 or a series circuit composed of the inductance element 6 and the second capacitative element 8 between the first external terminal and the third external terminal 1c respectively provided to the integrated circuit 1, and the intermediate-frequency circuit according to the invention can be made so that it hardly suffers disturbance from an adjacent channel by setting these resonance frequencies.

As described above, the intermediate-frequency circuit according to the invention is provided with the integrated circuit including the balanced type mixer provided with the first output terminal and the second output terminal as well as the balanced type intermediate-frequency amplifier provided with the first input terminal and the second input terminal, and then the first output terminal and the first input terminal as well as the second output terminal and the second input terminal are respectively connected via the first capacitative element formed in the integrated circuit, the first external terminal connected to the first output terminal, the second external terminal connected to the second output terminal and the third external terminal connected to the first input terminal are provided to the integrated circuit, and the intermediate frequency tuning circuit is connected between the first external terminal and the second external terminal and the first external terminal and the third external terminal are connected via the inductance element, therefore the parallel resonance circuit is formed by the inductance element and the first capacitative element, and the intermediate-frequency circuit is made to hardly suffer disturbance by a voice intermediate-frequency signal or a video intermediate-frequency signal by resonating the parallel resonance circuit with a frequency of the voice intermediate carrier of the adjacent channel on the downside or a frequency of the video intermediate carrier of the adjacent channel on the upside.

The second capacitative element is connected to the inductance element in series, the series-parallel resonance circuit is formed by the first capacitative element, the inductance element and the second capacitative element, the series resonance frequency of the series-parallel resonance circuit is substantially equalized to the central frequency of the intermediate frequency band and the parallel resonance frequency is equalized to a frequency of the voice intermediate carrier of the adjacent channel on the downside, therefore the tuning characteristic of the intermediate frequency band becomes sharp and further, the intermediate-frequency circuit more hardly suffers disturbance by a voice intermediate-frequency signal of the adjacent channel on the downside.

What is claimed is:

1. An intermediate-frequency circuit of a television tuner, comprising:

an integrated circuit including a balanced type mixer provided with a first output terminal and a second output terminal to convert a frequency, and a balanced type intermediate-frequency amplifier provided with a first input terminal and a second input terminal, wherein the first output terminal and the first input terminal as well as the second output terminal and the second input terminal are respectively connected via a first capacitative element formed in the integrated circuit;

wherein a first external terminal connected to the first output terminal, a second external terminal connected to the second output terminal and a third external terminal connected to the first input terminal are provided to the integrated circuit;

wherein an intermediate frequency tuning circuit that tunes to a substantially central frequency in an intermediate frequency band is connected between the first external terminal and the second external terminal; and wherein the first external terminal and the third external terminal are connected via an inductance element.

2. An intermediate-frequency circuit of a television tuner according to claim 1, wherein a second capacitative element is connected to the inductance element in series;

wherein a series-parallel resonance circuit is formed by the first capacitative element, the inductance element and the second capacitative element;

wherein a series resonance frequency of the series-parallel resonance circuit is substantially equalized to the central frequency; and wherein a parallel resonance frequency is equalized to a frequency of a voice intermediate carrier of an adjacent channel on a downside.

* * * * *

UNITED STATES PATENT AND TRADEMARK OFFICE
CERTIFICATE OF CORRECTION

PATENT NO. : 6,876,402 B2
DATED : April 5, 2005
INVENTOR(S) : Michinori Sasaki

It is certified that error appears in the above-identified patent and that said Letters Patent is hereby corrected as shown below:

<u>Title page,</u>
Item [57], ABSTRACT,
Lines 1-22, delete and substitute the following in its place.
-- An integrated circuit includes a balanced type mixer provided with a first output terminal and a second output terminal and a balanced type intermediate-frequency amplifier provided with a first input terminal and a second input terminal. The first input and output terminal and the second input and output terminal are respectively connected via a first capacitative element. An intermediate frequency tuning circuit is connected between a first external terminal connected to the first output terminal and a second external terminal connected to the second output terminal, and the first external terminal and a third external terminal connected to the first output terminal are connected via an inductance element. --.

Signed and Sealed this

Twenty-ninth Day of November, 2005

JON W. DUDAS
*Director of the United States Patent and Trademark Office*